(12) United States Patent
Tiwari

(10) Patent No.: US 10,659,051 B1
(45) Date of Patent: May 19, 2020

(54) BIDIRECTIONAL VOLTAGE TRANSLATOR WITH PULSE WIDTH CONTROL

(71) Applicant: NXP B.V., Eindhoven (NL)

(72) Inventor: Chandra Prakash Tiwari, Bangalore (IN)

(73) Assignee: NXP USA, Inc., Eindhoven (NL)

( * ) Notice: Subject to any disclaimer, the term of this patent is extended or adjusted under 35 U.S.C. 154(b) by 0 days.

(21) Appl. No.: 16/408,475

(22) Filed: May 10, 2019

(51) Int. Cl.
*H03K 19/0175* (2006.01)
*H03K 19/0185* (2006.01)

(52) U.S. Cl.
CPC ........... *H03K 19/018592* (2013.01); *H03K 19/018521* (2013.01); *H03K 19/01759* (2013.01)

(58) Field of Classification Search
CPC ............... H03K 19/018521; H03K 19/018592
See application file for complete search history.

(56) References Cited

U.S. PATENT DOCUMENTS

| | | | |
|---|---|---|---|
| 3,484,624 A | 12/1969 | Rasiel et al. | |
| 4,056,735 A | 11/1977 | Caswel | |
| 5,051,613 A | 9/1991 | Houser, Jr. et al. | |
| 7,006,389 B2 | 2/2006 | Cordoba | |
| 7,471,111 B2 | 12/2008 | Seth et al. | |
| 7,639,045 B2* | 12/2009 | Motamed | H03K 19/018592 326/82 |
| 7,683,672 B2 | 3/2010 | Bartlett | |
| 7,839,172 B2* | 11/2010 | Hori | H03K 19/01759 326/80 |
| 7,928,766 B2 | 4/2011 | Welty | |
| 9,461,624 B2 | 10/2016 | Ravula Lakshmi et al. | |
| 10,181,852 B1 | 1/2019 | Tiwari et al. | |
| 10,445,268 B2* | 10/2019 | Yan | G06F 13/1673 |
| 2008/0164932 A1* | 7/2008 | Welty | H03K 19/018585 327/333 |
| 2009/0289693 A1* | 11/2009 | Motamed | H03K 19/00315 327/437 |
| 2009/0295429 A1* | 12/2009 | Hori | H03K 19/0175 326/80 |

FOREIGN PATENT DOCUMENTS

EP          0678983 B1      8/1998

* cited by examiner

*Primary Examiner* — Alexander H Taningco
*Assistant Examiner* — Kurtis R Bahr

(57) ABSTRACT

A voltage translator having first and second one-shots shifts a voltage level of a first voltage signal to generate a second voltage signal, and vice-versa. The first one-shot generates a first driver signal when the first voltage signal goes from low to high based on a time duration for which the first voltage signal remains high. The second voltage signal is generated based on the first driver signal. Similarly, the second one-shot generates the first voltage signal when the second voltage signal goes from a low to high based on a time duration for which the second voltage signal remains high.

18 Claims, 7 Drawing Sheets

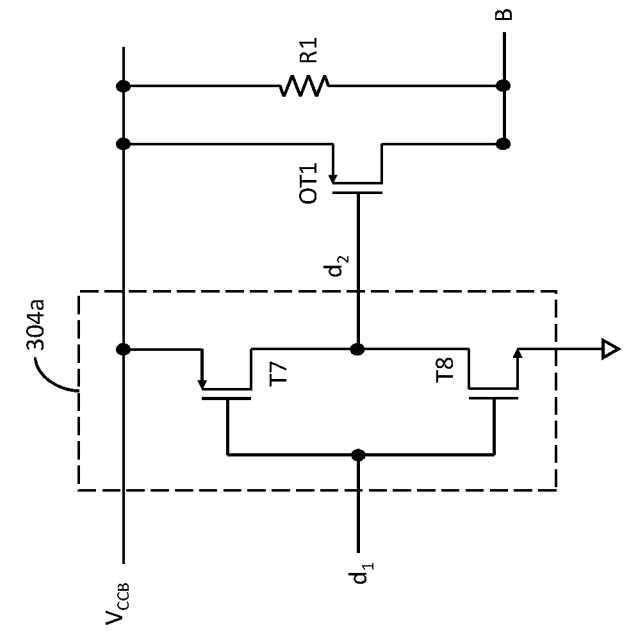
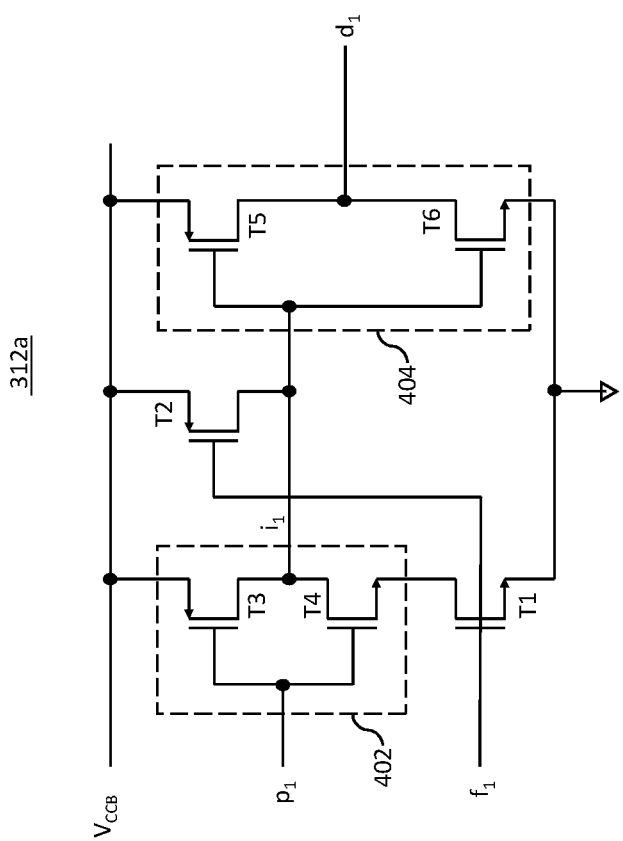
FIG. 4B
FIG. 4A

BIDIRECTIONAL VOLTAGE TRANSLATOR WITH PULSE WIDTH CONTROL

BACKGROUND

The present invention relates generally to electronic circuits, and, more particularly, to a bidirectional voltage translator.

Integrated circuits, such as system-on-chips (SoCs) and application specific integrated circuits (ASICs), often have multiple voltage domains that operate at different voltage levels. Level shifters or voltage translators are used as an interface between the voltage domains to resolve voltage incompatibility of signals passing from one domain to another.

FIG. 1 illustrates a conventional bidirectional voltage translator 100 that is used as an interface between first and second voltage domains that operate at first and second voltage levels $V_{CCA}$ and $V_{CCB}$, respectively. The voltage translator 100 receives a first voltage signal $V_1$ from the first voltage domain via a first input/output (I/O) terminal A. The first voltage signal $V_1$ has a first high state equal to the first voltage level (e.g., 1.8V), and a first low state equal to ground. The voltage translator 100 shifts the first voltage signal $V_1$ to generate a second voltage signal $V_2$ at a second I/O terminal B, where the second voltage signal $V_2$ has a second high state equal to the second voltage level (e.g., 3.6V) and a second low state equal to ground. In the other direction, the voltage translator 100 receives the second voltage signal $V_2$ from the second voltage domain via the second I/O terminal B, level shifts it, and transmits the level shifted signal as the first voltage signal $V_1$ to the first voltage domain via the first I/O terminal A.

The voltage translator 100 includes first and second one-shot circuits 102a and 102b, first and second output transistors OT1 and OT2, first and second resistors R1 and R2, a gate bias circuit 104, and a pass transistor PT. The first one-shot circuit 102a includes a first monostable multi-vibrator 106a and a first driver circuit 108a and the second one-shot circuit 102b includes a second monostable multi-vibrator 106b and a second driver circuit 108b.

The pass transistor PT and the first multi-vibrator 106a receive the first voltage signal $V_1$. The pass transistor PT is controlled by the gate bias circuit 104 based on the first voltage signal $V_1$. For example, when the first voltage signal $V_1$ is low, the pass transistor PT is activated, and the second voltage signal $V_2$ is generated at the second low state. Conversely, when the first voltage signal $V_1$ is high, the pass transistor PT is off.

When the first voltage signal $V_1$ goes from low to the first high state, the first multi-vibrator 106a generates a first one-shot pulse signal $p_1$. The first one-shot pulse signal $p_1$ is high active and is activated for a first pulse duration. The first driver circuit 108a receives the first one-shot pulse signal $p_1$ and generates a first driver signal $d_1$ to drive the first output transistor OT1. The first driver signal $d_1$ is an inverted version of the first pulse signal $p_1$. The first driver signal $d_1$ hence is low active and is activated for the first pulse duration.

The first output transistor OT1, which is a p-channel metal oxide semiconductor (PMOS) transistor, is activated for the first pulse duration. When the first output transistor OT1 is activated, the second voltage signal receives the second supply voltage $V_{CCB}$, so the first high state is level shifted to the second high state, thereby generating the second voltage signal $V_2$. Similarly, when the second voltage signal $V_2$ goes from high to low, the second one-shot circuit 102b, the second output transistor OT2, the second resistor R2, and the pass transistor PT generate the first voltage signal $V_1$.

The pulse width of the signal generated by the first one-shot is constant, which can be problematic. For example, if the time that the first voltage signal $V_1$ is high is less than the first one-shot pulse duration, then after $V_1$ goes low, which activates the pass transistor PT, so the second voltage signal $V_2$ goes low. However, as the first one-shot pulse has not elapsed, the first output transistor OT1 remains active, and hence, the second voltage signal $V_2$ remains at the second high state. Thus, the voltage translator 100 will malfunction when the length of time the first voltage signal is high is less than the width of the pulse of the first one-shot.

Therefore, it would be advantageous to have a voltage translator that controls the pulse width of driver signals that drive its output transistors.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 4A is a schematic circuit diagram of an internal driver circuit of the voltage translator in accordance with one embodiment of the present invention;

FIG. 4B is a schematic circuit diagram of an output driver circuit of the voltage translator in accordance with one embodiment of the present invention;

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a bidirectional voltage translator having first and second one-shot circuits. The first one-shot circuit receives a first voltage signal and generates a first pulse signal when the first voltage signal transitions from a first low state to a first high state.

The first one-shot circuit also generates a first driver signal based on the first pulse signal and the duration that the first voltage signal is high. The first driver signal is used to generate a second voltage signal. The second one-shot circuit receives the second voltage signal and generates a second pulse signal when the second voltage signal transitions from a second low state to a second high state. The second one-shot circuit also generates a second driver signal based on the second pulse signal and a duration of the second voltage signal. The second driver signal is used to generate the first voltage signal.

In another embodiment, the present invention provides a system for interfacing a first digital device such as a microprocessor or microcontroller that operates at a first voltage level and a peripheral device (e.g., a sensor) that operates at a second voltage level that is different from the first voltage level. The system includes first and second one-shot circuits. The first one-shot circuit receives a first voltage signal from the first digital device and generates a first pulse signal when the first voltage signal transitions from a first low state to a first high state. The first one-shot circuit also generates a first driver signal based on the first pulse signal and a duration of the first voltage signal (i.e., the length of time the first voltage signal is high). A second voltage signal, which is provided to the peripheral device, is generated based on the first driver signal. In the other direction, the second one-shot circuit receives the second voltage signal from the peripheral device and generates a second pulse signal when the second voltage signal transitions from a second low state to a second high state. The second one-shot circuit also generates a second driver signal based on the second pulse signal and a duration of the second voltage signal. The first voltage signal, which is provided to the first digital device, then is generated using the second driver signal.

Figure 1:
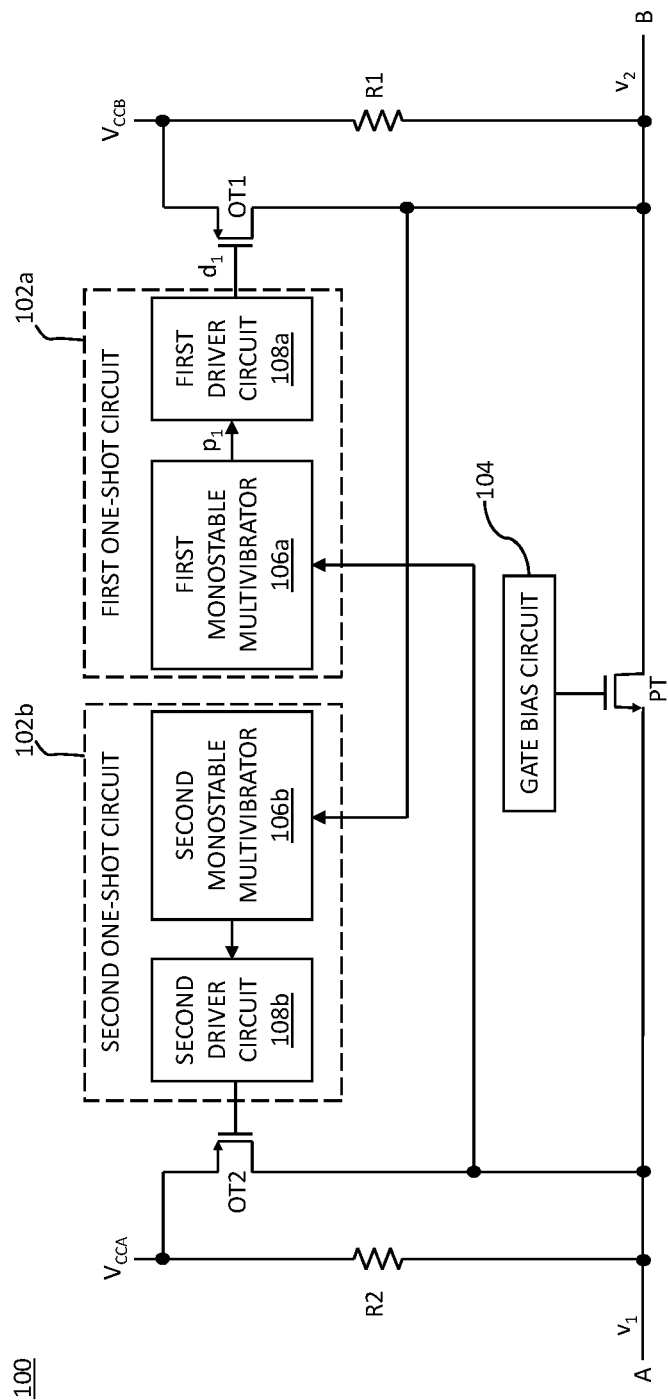
FIG. 1 is a schematic block diagram of a conventional bidirectional voltage translator.
Figure 2:
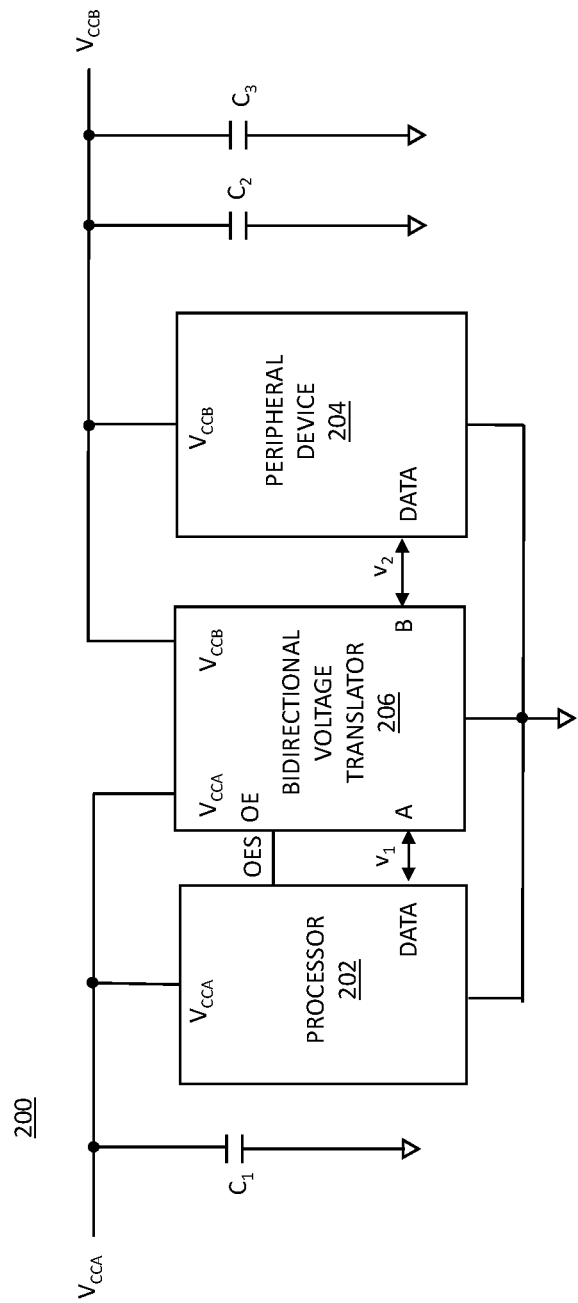
FIG. 2 is a schematic block diagram of a bidirectional communication system in accordance with an embodiment of the present invention.

Referring now to FIG. 2, a schematic block diagram of a bidirectional communication system 200 in accordance with an embodiment of the present invention is shown. The bidirectional communication system 200 includes a processor 202, a peripheral device 204, and a bidirectional voltage translator or level shifter 206 that interfaces the processor 202 with the peripheral device 204.

The processor 202 is connected between a first supply voltage $V_{CCA}$ having a first voltage level and ground. Similarly, the peripheral device 204 is connected between a second supply voltage $V_{CCB}$ having a second voltage level and ground. In one embodiment, the second voltage level is greater than the first voltage level, and in another embodiment, the first voltage level is greater than the second voltage level. In the following discussion, it is assumed that the second voltage level is greater than the first voltage level (i.e., $V_{CCB} > V_{CCA}$).

The voltage translator 206 is connected between the processor 202 and the peripheral device 204 for shifting the voltage levels of signals passed between the processor 202 and the peripheral device 204. The passing of the signals is indicated by the arrows from first and second input/output (I/O) terminals A and B of the voltage translator 206 to data inputs of the processor 202 and the peripheral device 204, respectively. The signal between the processor 202 and the voltage translator 206 is referred to as a first voltage signal $v_1$ and the signal between the peripheral device 204 and the voltage translator 206 is referred to as a second voltage signal $v_2$.

The processor 202 also provides an output enable signal OES to the voltage translator 206 for controlling the voltage translator 206. For example, the voltage translator 206 is activated when the output enable signal OES is high and deactivated when the output enable signal OES is low.

The processor 202 actually could be any digital device, but a processor is used here as an example. Some other examples include a microprocessor, a microcontroller, an application specific integrated circuit (ASIC), a system on a chip (SOC), etc. Some examples of the peripheral device 204 include a subscriber identification module (SIM) card, a secure digital (SD) card, a multimedia card, a sensor such as a pressure sensor, and interfaces such as a serial peripheral interface (SPI) or an inter-integrated circuit (I²C). However, it will be apparent to a person having ordinary skill in the art that the peripheral device 204 is not limited to the above-mentioned examples and may be any circuit or device that communicates with the processor 202, but has a different operating voltage than the processor 202.

The voltage translator 206 is connected to the first and second supply voltages $V_{CCA}$ and $V_{CCB}$ and ground. The first and second I/O terminals A and B of the voltage translator 206 are connected to the processor 202 and the peripheral device 204, respectively. The peripheral device 204 acts as a capacitive load to the voltage translator 206. An SPI bus, which operates at high frequencies (e.g., 5 megahertz (MHz) to 50 MHz) is an example of a moderate capacitive load, while an I₂C bus, which operates at low frequencies (e.g., 0.512 MHz to 1 MHz) is an example of a high capacitive load.

The level translator receives the first voltage signal $v_1$ from the processor 202 at the first I/O terminal A, level shifts $v_1$ it, and then transmits the level shifted signal as the second voltage signal $v_2$ to the peripheral device 204 by way of the second I/O terminal B. In the other direction, the level translator receives the second voltage signal $v_2$ at the second I/O terminal B from the peripheral device 204, level shifts it, and then transmits the level shifted signal as the first voltage signal $v_1$ to the processor 202 by way of the first I/O terminal A.

The voltage translator 206 further has an output enable terminal (OE) for receiving the output enable signal OES. The voltage translator 206 is activated by the output enable signal OES.

The bidirectional communication system 200 further includes first through third capacitors $C_1$-$C_3$. The first capacitor $C_1$ is connected between the first power supply and ground and filters out voltage ripples in the first supply voltage $V_{CCA}$. The second and third capacitors $C_2$ and $C_3$ are connected between the second power supply and ground and filter out voltage ripples in the second supply voltage $V_{CCB}$.

Figure 3:
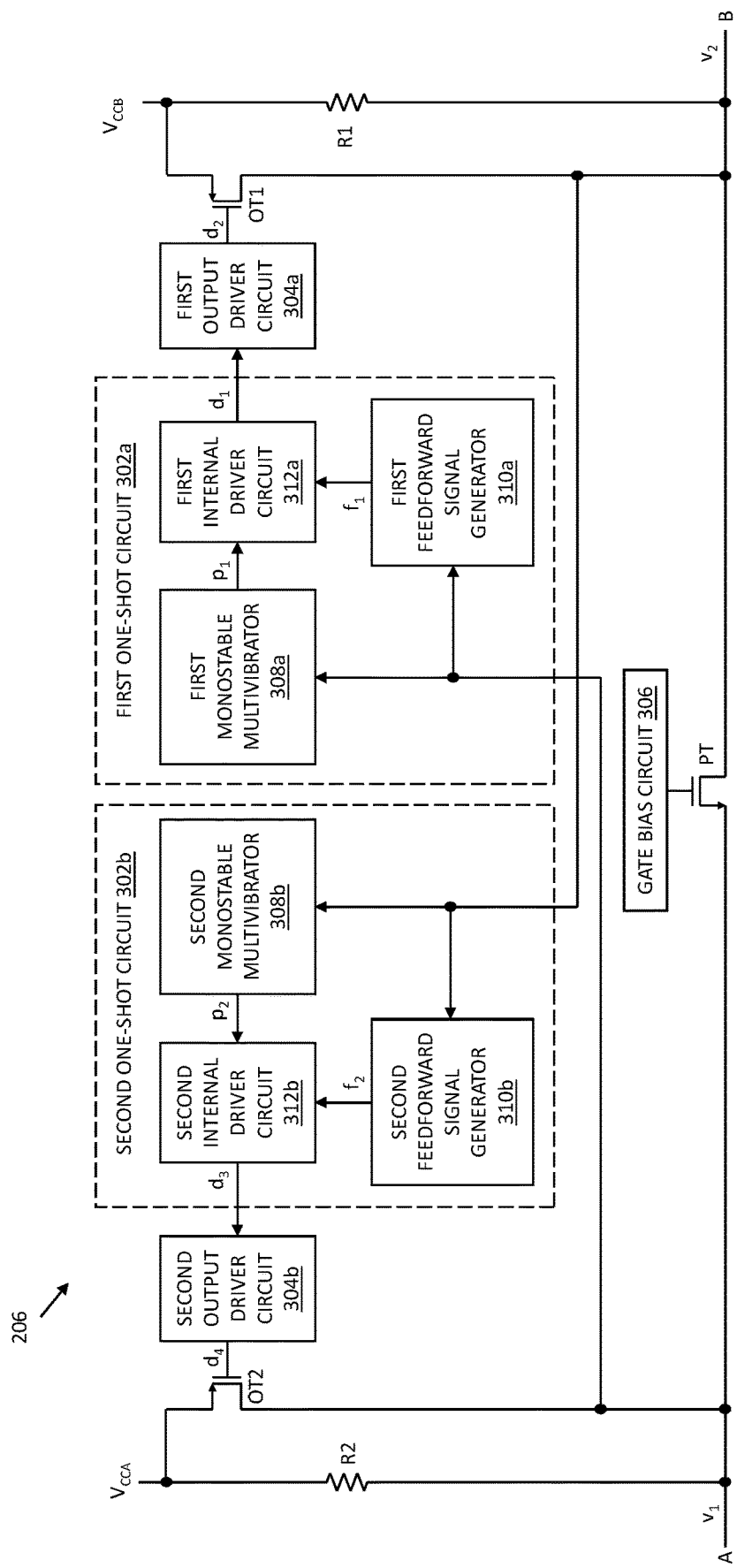
FIG. 3 is a schematic block diagram of a voltage translator of the bidirectional communication system of FIG. 2 in accordance with an embodiment of the present invention.

Referring now to FIG. 3, a schematic block diagram of the voltage translator 206 in accordance with an embodiment of the present invention is shown. FIG. 3 shows an open-drain configuration of the voltage translator 206. The voltage translator 206 includes first and second one-shot circuits 302a and 302b, first and second output driver circuits 304a and 304b, first and second output transistors OT1 and OT2, first and second resistors R1 and R2, a pass transistor PT, and a gate bias circuit 306.

The first one-shot circuit 302a is activated when the first voltage signal $v_1$ goes from low (i.e., a logic low state) to a first high state. Similarly, the second one-shot circuit 302b is activated when the second voltage signal $v_2$ transitions from low to second high state. The low state has a voltage level equal to ground, and the first and second high states have voltage levels equal to the first and second voltage levels $V_{CCA}$ and $V_{CCB}$, respectively.

The first one-shot circuit 302a includes a first monostable multi-vibrator 308a, a first feedforward signal generator 310a, and a first internal driver circuit 312a. Similarly, the second one-shot circuit 302b includes a second monostable multi-vibrator 308b, a second feedforward signal generator 310b, and a second internal driver circuit 312b.

The first multi-vibrator 308a is a one-shot pulse generator that is connected to the first I/O terminal A and receives the first voltage signal $v_1$. The first multi-vibrator 308a is activated when the first voltage signal $v_1$ goes from low to the first high state, at which time it generates a first one-shot pulse signal $p_1$. The first one-shot pulse signal $p_1$ has a high state equal to the second high state (i.e., $V_{CCB}$) and a low state equal to ground. Further, the first pulse signal $p_1$ is high active and has a first pulse duration $T_{p1}$ (i.e., the first pulse signal $p_1$ remains high for the first pulse duration $T_{p1}$). The first pulse duration $T_{p1}$ is constant (e.g., 50 nanoseconds (ns)). An example of the first monostable multi-vibrator 308a is a 555 timer.

The first feedforward signal generator 310a also is connected to the first I/O terminal A and receives the first voltage signal $v_1$. The first feedforward signal generator 310a performs signal processing operations on the first voltage signal $v_1$ to generate a first feedforward signal $f_1$. The signal processing operations include amplification, attenuation, phase delay, and phase advance. The signal processing operations are performed for a first time duration $T_{v1}$ (i.e., the length of time that the first voltage signal $v_1$ is high). The first feedforward signal $f_1$ has a high state equal to the second high state (i.e., $V_{CCB}$) and a low state equal to ground. Further, the first feedforward signal $f_1$ is high active and is activated for a first feedforward time duration $T_{f1}$ (i.e., the first feedforward signal $f_1$ is high for the first feedforward time duration $T_{f1}$). The first feedforward time duration $T_{f1}$ is equal to the first time duration $T_{v1}$.

The first internal driver circuit 312a is connected to the first multi-vibrator 308a and the first feedforward signal generator 310a for receiving the first one-shot pulse signal $p_1$ and the first feedforward signal $f_1$, respectively. The first internal driver circuit 312a generates a first driver signal $d_1$ based on the first one-shot pulse signal $p_1$ and the first feedforward signal $f_1$. The first driver signal $d_1$ has the second high and low states. The first driver signal $d_1$ also is high active and is activated for a first driver signal pulse duration $T_{d1}$ (i.e., the first driver signal $d_1$ remains high for the first driver signal pulse duration $T_{d1}$). When the first voltage signal $v_1$ is a low-frequency signal (i.e., the first time duration $T_{v1}$ is greater than or equal to the first one-shot pulse duration $T_{p1}$), the first driver time duration $T_{d1}$ is equal to the first one-shot pulse duration $T_{p1}$. When the first voltage signal $v_1$ is a high-frequency signal (i.e., the first time duration $T_{v1}$ is less than the first one-shot pulse duration $T_{p1}$), the first driver time duration $T_{d1}$ is equal to the first feedforward time duration $T_{f1}$.

The first output driver circuit 304a is connected to the first internal driver circuit 312a and receives the first driver signal $d_1$. The first output driver circuit 304a generates a second driver signal $d_2$, based on the first driver signal $d_1$, and is an inverted version of the first driver signal $d_1$. The second driver signal $d_2$ hence is an active low signal and is activated for a second driver pulse duration $T_{d2}$ (i.e., the second driver signal $d_2$ remains low for the second driver pulse duration $T_{d2}$). The second driver pulse duration $T_{d2}$ is equal to the first driver pulse duration $T_{d1}$. The first output driver circuit 304a provides the second driver signal $d_2$ to the gate of the first output transistor OT1.

The first output transistor OT1 may be a PMOS transistor. The first output transistor OT1 has a source connected to the second power supply for receiving the second supply voltage $V_{CCB}$, a drain connected to the second I/O terminal B, and a gate connected to the first output driver circuit 304a for receiving the second driver signal $d_2$. Thus, the first output transistor OT1 is activated for the second driver pulse duration $T_{d2}$ when the second driver signal $d_2$ is low.

When the first output transistor OT1 is activated, the second I/O terminal B is pulled up to the second supply voltage $V_{CCB}$ via the first output transistor OT1. The first resistor R1 is connected between the second power supply and the second I/O terminal B. When the first output transistor OT1 is deactivated (i.e., after the second driver pulse duration $T_{d2}$ has elapsed) and the first voltage signal $v_1$ is high, then the second I/O terminal B receives the second supply voltage $V_{CCB}$ via the first resistor R1.

The second multi-vibrator 308b is a one-shot pulse generator that is connected to the second I/O terminal B for receiving the second voltage signal $v_2$. The second multi-vibrator 308b is activated when the second voltage signal $v_2$ transitions from the low to the second high state, and generates a second one-shot pulse signal $p_2$. The second one-shot pulse signal $p_2$ has the first high and low states. Further, the second one-shot pulse signal $p_2$ is high active and is activated for a second one-shot pulse duration $T_{p2}$ (i.e., the second one-shot pulse signal $p_2$ remains high for the second one-shot pulse duration $T_{p2}$). The second one-shot pulse duration $T_{p2}$ is constant. In one embodiment, the second one-shot pulse duration $T_{p2}$ is equal to the first one-shot pulse duration $T_{p1}$. In another embodiment, the second one-shot pulse duration $T_{p2}$ is different from the first one-shot pulse duration $T_{p1}$. An example of the second monostable multi-vibrator 308b is a 555 timer.

The second feedforward signal generator 310b is connected to the second I/O terminal B and receives the second voltage signal $v_2$. The second feedforward signal generator 310b performs the signal processing operations on the second voltage signal $v_2$ to generate a second feedforward signal $f_2$ like the first feedforward signal generator 310a performed on the first voltage signal $v_1$. The signal processing operations are performed for a second time duration $T_{v2}$ (i.e., a time duration for which the second voltage signal $v_2$ remains high). The second feedforward signal $f_2$ has the first high and low states. Further, the second feedforward signal $f_2$ is high active and is activated for a second feedforward time duration $T_{f2}$ (i.e., the second feedforward signal $f_2$ remains high for the second feedforward time duration $T_{f2}$). The second feedforward time duration $T_{f2}$ is equal to the second time duration $T_{v2}$.

The second internal driver circuit 312b is connected to the second multi-vibrator 308b and the second feedforward signal generator 310b for receiving the second one-shot pulse signal $p_2$ and the second feedforward signal $f_2$, respectively. The second internal driver circuit 312b generates a third driver signal $d_3$ based on the second one-shot pulse signal $p_2$ and the second feedforward signal $f_2$. The third driver signal $d_3$ has the first high and low states. Further, the third driver signal $d_3$ is high active and is activated for a third driver pulse duration $T_{d3}$ (i.e., the third driver signal $d_3$ remains high for the third driver pulse duration $T_{d3}$). When the second voltage signal $v_2$ is a low-frequency signal (i.e., the second time duration $T_{v2}$ is greater than or equal to the second one-shot pulse duration $T_{p2}$), the third driver pulse duration $T_{d3}$ is equal to the second one-shot pulse duration $T_{p2}$. When the second voltage signal $v_2$ is a high-frequency signal (i.e., the second time duration $T_{v2}$ is less than the second one-shot pulse duration $T_{p2}$), the third driver pulse duration $T_{d3}$ is equal to the second feedforward time duration $T_{f2}$.

The second output driver circuit 304b is connected to the second internal driver circuit 312b and receives the third driver signal $d_3$. Based on the third driver signal $d_3$, the second output driver circuit 304b generates a fourth driver signal $d_4$, which is an inverted version of the third driver signal $d_3$. The fourth driver signal $d_4$ hence is low active and is activated for a fourth driver pulse duration $T_{d4}$ (i.e., the fourth driver signal $d_4$ remains low for the fourth driver pulse duration $T_{d4}$). The fourth driver pulse duration $T_{d4}$ is equal to the third driver pulse duration $T_{d3}$. Further, the second output driver circuit 304b provides the fourth driver signal $d_4$ to the gate of the second output transistor OT2.

The second output transistor OT2 may be a PMOS transistor having a source connected to the first power supply for receiving the first supply voltage $V_{CCA}$, a drain connected to the first I/O terminal A, and a gate connected to the second output driver circuit 304b for receiving the fourth driver signal $d_4$. Thus, the second output transistor OT2 is activated for the fourth driver pulse duration $T_{d4}$ when the fourth driver signal $d_4$ is active.

When the second output transistor OT2 is activated, the first I/O terminal A receives the first supply voltage $V_{CCA}$ via the second output transistor OT2. The second resistor R2 is connected between the first power supply and the first I/O terminal A. When the second output transistor OT2 is deactivated (i.e., after the fourth driver pulse duration $T_{d4}$ has elapsed) and the second voltage signal $v_2$ is high, then the first I/O terminal A receives the first supply voltage $V_{CCA}$ via the second resistor R2.

The pass transistor PT may be a NMOS transistor having source and drain terminals connected to the first and second I/O terminals A and B, respectively, and a gate connected to the gate bias circuit 306. To bias the gate of the pass transistor PT, the gate bias circuit 306 generates a gate voltage equal to $V_T+V_{CCA}$, where '$V_T$' is a threshold voltage of the pass transistor PT.

When either of the first or second voltage signals $v_1$ or $v_2$ is low, the pass transistor PT is activated. The gate bias circuit 306 biases the gate of the pass transistor PT such that the pass transistor PT is deactivated when the first or second voltage signals $v_1$ or $v_2$ transitions from low to high. The operation of the gate bias circuit 306 is known by those of skill in the art.

In operation, the voltage translator 206 receives the first voltage signal $v_1$ as an input at the first I/O terminal A from the processor 202. When the first voltage signal $v_1$ transitions from low to the first high state (i.e., from 0V to 1.8V), the first multi-vibrator 308a and the first feedforward signal generator 310a sense the transition and generate the first one-shot pulse signal $p_1$ and the first feedforward signal $f_1$, respectively.

The first internal driver circuit 312a receives the first one-shot pulse signal $p_1$ and the first feedforward signal $f_1$, and generates the first driver signal $d_1$. When the first time duration $T_{v1}$ is greater than or equal to the first one-shot pulse duration $T_{p1}$, the first driver signal $d_1$ is activated for the first one-shot pulse duration $T_{p1}$. In other words, when the first time duration $T_{v1}$ is greater than or equal to the first one-shot pulse duration $T_{p1}$, the first driver pulse duration $T_{d1}$ is equal to the first one-shot pulse duration $T_{p1}$. When the first time duration $T_{v1}$ is less than the first one-shot pulse duration $T_{p1}$, the first driver signal $d_1$ is activated for the first feedforward time duration $T_{f1}$. In other words, when the first time duration $T_{v1}$ is less than the first one-shot pulse duration $T_{p1}$, the first driver pulse duration $T_{d1}$ is equal to the first feedforward time duration $T_{f1}$. The generation of the first driver signal $d_1$ is explained in more detail with respect to FIG. 4A.

The first output driver circuit 304a receives the first driver signal $d_1$ and generates the second driver signal $d_2$ for the second driver pulse duration $T_{d2}$. Thus, the first output transistor OT1 is activated for the second driver pulse duration $T_{d2}$. Once activated, the first output transistor OT1 pulls up the voltage at the second I/O terminal B to the second voltage level $V_{CCB}$. Thus, the second voltage signal $v_2$ having the second voltage level is provided at the second I/O terminal B. In other words, the voltage translator 206 receives the first voltage signal $v_1$ at the first voltage level, level shifts it to the second voltage level, and provides the level shifted voltage signal to the peripheral device 204 by way of the second I/O terminal B. The generation of the second driver signal $d_2$ is explained in more detail with reference to FIG. 4B.

The second driver signal $d_2$ is de-asserted after the second driver pulse duration $T_{d2}$ has elapsed, which turns off the first output transistor OT1. When the first output transistor OT1 is turned off and the first voltage signal $v_1$ is high, the second I/O terminal B may discharge due to a leakage current passing through the pass transistor PT. However, the voltage level at the second I/O terminal B is pulled up to the second voltage level $V_{CCB}$ via the first resistor R1. Thus, the second I/O terminal B remains at the second voltage level while the first voltage signal $v_1$ is high.

When the first voltage signal $v_1$ transitions from the first high state to the first low state (i.e., from 1.8V to 0V), the pass transistor PT is activated. The second I/O terminal B is discharged by way of the pass transistor PT and the voltage level at the second I/O terminal B is pulled down to ground.

The voltage translator 206 similarly may receive the second voltage signal $v_2$ as an input at the second I/O terminal B from the peripheral device 204. In such scenario, the second one-shot circuit 302b is activated when the second voltage signal $v_2$ transitions from low to the second high state. The second multi-vibrator 308b and the second feedforward signal generator 310b receive the second voltage signal $v_2$ and generate the second one-shot pulse signal $p_2$ and the second feedforward signal $f_2$, respectively.

The second internal driver circuit 312b receives the second one-shot pulse signal $p_2$ and the second feedforward signal $f_2$, and generates the third driver signal $d_3$. When the second time duration $T_{v2}$ is greater than or equal to the second one-shot pulse duration $T_{p2}$, the third driver signal $d_3$ is activated for the second one-shot pulse duration $T_{p2}$. In other words, when the second time duration $T_{v2}$ is greater than or equal to the second one-shot pulse duration $T_{p2}$, the third driver pulse duration $T_{d3}$ is equal to the second one-shot pulse duration $T_{p2}$. When the second time duration $T_{v2}$ is less than the second one-shot pulse duration $T_{p2}$, the third driver signal $d_3$ is activated for the second feedforward pulse duration $T_{f2}$. In other words, when the second time duration $T_{v2}$ is less than the second one-shot pulse duration $T_{p2}$, the third driver pulse duration $T_{d3}$ is equal to the second feedforward pulse duration $T_{f2}$. The generation of the third driver signal $d_3$ is explained in more detail in conjunction with FIG. 5A.

The second output driver circuit 304b receives the third driver signal $d_3$ and generates the fourth driver signal $d_4$ for the fourth driver pulse duration $T_{d4}$. Thus, the second output transistor OT2 is activated for the fourth driver pulse duration $T_{d4}$. The second output transistor OT2 pulls up the voltage at the first I/O terminal A to the first voltage level of the first supply voltage $V_{CCA}$, thereby providing the first voltage signal $v_1$ at the first I/O terminal A. In other words, the voltage translator 206 receives the second voltage signal $v_2$ at the second voltage level, level shifts it to the first voltage level, and provides the level-shifted voltage signal (i.e., the first voltage signal $v_1$) to the processor 202 by way of the first I/O terminal A. The generation of the fourth driver signal $d_4$ is explained in more detail in conjunction with FIG. 5B.

The fourth driver signal $d_4$ is de-asserted after the fourth driver pulse duration $T_{d4}$ has elapsed, thereby deactivating the second output transistor OT2. When the second output transistor OT2 is deactivated and the second voltage signal $v_2$ is in the second high state, the first I/O terminal A may discharge due to leakage current passing through the pass transistor PT. However, the voltage level at the first I/O terminal A is pulled up to the first voltage level by way of the second resistor R2. Thus, the first I/O terminal A is remains at the first voltage level while the second voltage signal $v_2$ is in the second high state.

When the second voltage signal $v_2$ transitions from the second high state to the second low state (i.e., from 3.6V to 0V), the pass transistor PT is activated. The first I/O terminal A is discharged by way of the pass transistor PT, and the voltage level at the first I/O terminal A is pulled down to ground.

Referring now to FIG. 4A, a schematic circuit diagram of the first internal driver circuit 312a in accordance with an embodiment of the present invention is shown. The first internal driver circuit 312a includes first and second transistors T1 and T2, and first and second inverters 402 and 404. In one embodiment, the first and second inverters 402 and 404 are complementary metal-oxide semiconductor (CMOS) inverters.

The first transistor T1 may be an NMOS transistor having a source terminal connected to ground, a drain terminal connected to the first inverter 402, and a gate terminal connected to the first feedforward signal generator 310a for receiving the first feedforward signal $f_1$.

The first inverter 402 is connected to the first multivibrator 308a for receiving the first one-shot pulse signal $p_1$ and generating a first intermediate signal $i_1$, which is an inverted version of the first one-shot pulse signal $p_1$.

The first inverter 402 includes third and fourth transistors T3 and T4. The third transistor T3 may be a PMOS transistor having a source connected to the second power supply for receiving the second supply voltage $V_{CCB}$ and a gate that receives the first one-shot pulse signal $p_1$. The third transistor T3 has a drain connected to the second inverter 404 for providing the first intermediate signal $i_1$ to the second inverter 404. The fourth transistor T4 may be an NMOS transistor having gate and drain terminals connected to the gate and drain terminals of the third transistor T3, respectively, and a source terminal connected to the drain terminal of the first transistor T1.

The second transistor T2 may be a PMOS transistor having a source connected to the second power supply for receiving the second supply voltage $V_{CCB}$, a gate connected to the first feedforward signal generator 310a for receiving the first feedforward signal $f_1$, and a drain connected to a node between the output of the first inverter 402 and an input of second inverter 404.

The second inverter 404 receives the first intermediate signal $i_1$ and generates the first driver signal $d_1$. The second inverter 404 includes fifth and sixth transistors T5 and T6. The fifth transistor T5 may be a PMOS transistor having a source connected to the second power supply for receiving the second supply voltage $V_{CCB}$ and a gate connected to the drain terminals of the second through fourth transistors T2-T4 for receiving the first intermediate signal $i_1$. The sixth transistor T6 may be an NMOS transistor having a gate connected to the gate of the fifth transistor T5, a source connected to ground, and a drain connected to a drain of the sixth transistor T6. The output of the second inverter 404, the first driver signal $d_1$, is provided from a node between the drains of the fifth and sixth transistors T5 and T6.

When the first voltage signal $v_1$ transitions from the first low state to the first high state (i.e., from 0V to 1.8V), the first one-shot pulse signal $p_1$ and the first feedforward signal $f_1$ are asserted. When the first feedforward signal $f_1$ is asserted, the first transistor T1 is activated and the second transistor T2 is deactivated. Thus, the source of the fourth transistor T4 is connected to ground by way of the first transistor T1, thereby activating the first inverter 402. The first inverter 402 receives the first one-shot pulse signal $p_1$ and generates the first intermediate signal $i_1$ by inverting the first one-shot pulse signal $p_1$. Thus, a voltage level of the first intermediate signal $i_1$ is equal to ground. The second inverter 404 receives the first intermediate signal $i_1$ and asserts the first driver signal $d_1$. Thus, a voltage level of the first driver signal $d_1$ is equal to the second voltage level.

When the first pulse duration $T_{v1}$ is greater than or equal to the first one-shot pulse duration $T_{p1}$ (i.e., the first voltage signal $v_1$ is a low-frequency signal), the first feedforward signal duration $T_{f1}$ is greater than the first one-shot pulse duration $T_{p1}$. Thus, after the first one-shot pulse duration $T_{p1}$ has elapsed, the first one-shot pulse signal $p_1$ goes low, while the first feedforward signal $f_1$ stays high. As the first feedforward signal $f_1$ remains in the second high state, the first inverter 402 remains active and the second transistor T2 is inactive. The first inverter 402 hence inverts the first one-shot pulse signal $p_1$ (low to high). Thus, the first intermediate signal $i_1$ transitions from low to the second high state. The second inverter 404 receives the first intermediate signal $i_1$ (high) and causes the first driver signal $d_1$ to go low.

When the duration of the first signal $T_{v1}$ is less than the first one-shot pulse duration $T_{p1}$ (i.e., the first voltage signal $v_1$ is a high-frequency signal), the first feedforward signal duration $T_{f1}$ is less than the first one-shot pulse duration $T_{p1}$. Thus, after the first pulse duration $T_{v1}$ has elapsed, the first feedforward signal $f_1$ is deactivated, whereas the first one-shot pulse signal $p_1$ remains activated. As the first feedforward signal $f_1$ is low, the first transistor T1 is deactivated and the second transistor T2 is activated. Thus, the first intermediate signal $i_1$ is in the second high state. The second inverter 404 receives the first intermediate signal $i_1$, which is high, and inverts it so the first driver signal $d_1$ goes low.

Referring now to FIG. 4B, a schematic circuit diagram of the first output driver circuit 304a in accordance with an embodiment of the present invention is shown. The first output driver circuit 304a receives the first driver signal $d_1$ and generates the second driver signal $d_2$. As shown in FIG. 4B, in the presently preferred embodiment, the first output driver circuit 304a is a CMOS inverter circuit that inverts the value of the first driver signal $d_1$.

More particularly, the first output driver circuit 304a includes seventh and eighth transistors T7 and T8. The seventh transistor T7 may be a PMOS transistor having a source terminal connected to the second power supply for receiving the second supply voltage $V_{CCB}$, a gate terminal connected to the first internal driver circuit 312a for receiving the first driver signal $d_1$, and a drain terminal connected to the gate terminal of the first output transistor OT1 for providing the second driver signal $d_2$ to the transistor OT1. The eighth transistor T8 may be an NMOS transistor having a source terminal connected to ground, and gate and drain terminals connected to the gate and drain terminals of the seventh transistor T7, respectively.

When the first driver signal $d_1$ is high, the second driver signal $d_2$ is low, in which case the first output driver circuit 304a turns on the first output transistor OT1. Similarly, when the first driver signal $d_1$ is low, the second driver signal $d_2$ is high, which turns off the first output transistor OT1.

Figure 5B:
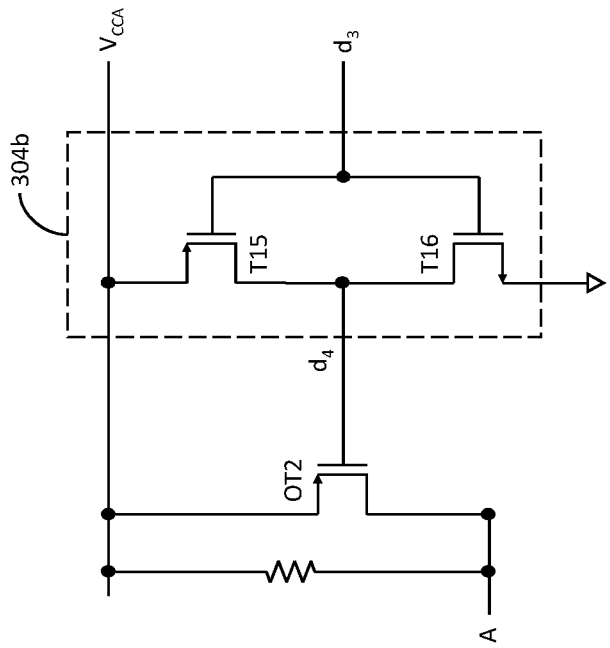
FIG. 5B is a schematic circuit diagram of an output driver circuit of the voltage translator in accordance with another embodiment of the present invention.
Figure 5A:
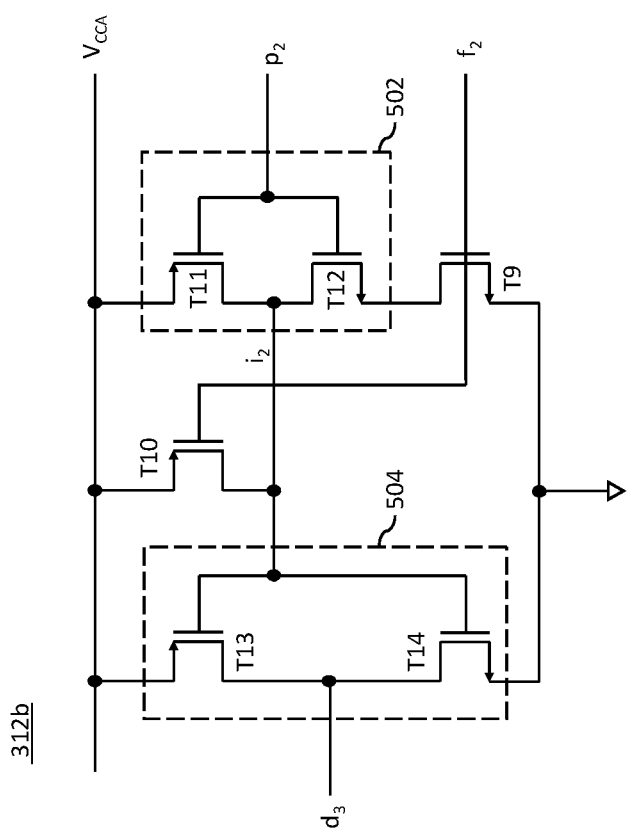
FIG. 5A is a schematic circuit diagram of an internal driver circuit of the voltage translator in accordance with another embodiment of the present invention.

Referring now to FIG. 5A, a schematic circuit diagram of the second internal driver circuit 312b in accordance with an embodiment of the present invention is shown. The second internal driver circuit 312b includes ninth and tenth transistors T9 and T10, and third and fourth inverters 502 and 504. In one embodiment, the third and fourth inverters 502 and 504 are CMOS inverters.

The ninth transistor T9 may be an NMOS transistor having a source connected to ground, a drain connected to the third inverter 502, and a gate connected to the second feedforward signal generator 310b for receiving the second feedforward signal $f_2$.

The third inverter 502 is connected to the second multivibrator 308b for receiving the second one-shot pulse signal $p_2$. Based on the second one-shot pulse signal $p_2$, the third inverter 502 generates a second intermediate signal $i_2$. The second intermediate signal $i_2$ is an inverted version of the second one-shot pulse signal $p_2$.

The third inverter 502 includes eleventh and twelfth transistors T11 and T12. The eleventh transistor T11 may be a PMOS transistor having a source connected to the first power supply for receiving the first supply voltage $V_{CCA}$, a gate that receives the second one-shot pulse signal $p_2$, and a drain connected to the fourth inverter 504 for outputting the second intermediate signal $i_2$ thereto. The twelfth transistor T12 may be an NMOS transistor having gate and drain terminals connected to the gate and drain terminals of the eleventh transistor T11, respectively, and a source terminal connected to the drain terminal of the ninth transistor T9.

The tenth transistor T10 may be a PMOS transistor having a source connected to the first power supply for receiving the first supply voltage $V_{CCA}$, a gate connected to the second feedforward signal generator 310b for receiving the second feedforward signal $f_2$, and a drain connected to a node between the drains of the eleventh and twelfth transistors T11 and T12.

The fourth inverter 504 receives the second intermediate signal $i_2$ and generates the third driver signal $d_3$. The fourth inverter 504 includes thirteenth and fourteenth transistors T13 and T14, which are connected in series between the first power supply ($V_{CCA}$) and ground.

When the second voltage signal $v_2$ transitions from the second low state to the second high state (i.e., from 0V to 3.6V), the second one-shot pulse signal $p_2$ and the second feedforward signal $f_2$ are asserted. When the second feedforward signal $f_2$ is asserted (i.e., when the second feedforward signal $f_2$ is high), the ninth transistor T9 is turned on and the tenth transistor T10 is turned off. The third inverter 502 receives the second one-shot pulse signal $p_2$ and generates the second intermediate signal $i_2$ by inverting the second one-shot pulse signal $p_2$. Thus, since the second one-shot pulse signal $p_2$ is high, the second intermediate signal $i_2$ goes low. The fourth inverter 504 receives the second intermediate signal $i_2$ (low) and asserts the third driver signal $d_3$ (high).

When the duration of the second voltage signal $T_{v2}$ is greater than or equal to the second one-shot pulse duration $T_{p2}$ (i.e., the second voltage signal $v_2$ is a low-frequency signal), the second feedforward signal duration $T_{f2}$ is greater than the second one-shot pulse duration $T_{p2}$. Thus, after the second one-shot pulse duration $T_{p2}$ has elapsed, the second one-shot pulse signal $p_2$ is deactivated, whereas the second feedforward signal $f_2$ remains asserted. As the second feedforward signal $f_2$ remains high, the third inverter 502 remains activated and the tenth transistor T10 remains deactivated. The third inverter 502 hence inverts the second one-shot pulse signal $p_2$. Thus, the second intermediate signal $i_2$ transitions from the first low state to the first high state. The fourth inverter 504 receives the high second intermediate signal $i_2$ and generates a low third driver signal $d_3$.

When the duration of the second voltage signal $T_{v2}$ is less than the second one-shot pulse duration $T_{p2}$ (i.e., the second voltage signal $v_2$ is a high-frequency signal), the duration of the second feedforward signal $T_{f2}$ is less than the second one-shot pulse duration $T_{p2}$. Thus, after the second pulse signal $T_{v2}$ goes low, the second feedforward signal $f_2$ is deactivated, whereas the second one-shot pulse signal $p_2$ remains activated. As the second feedforward signal $f_2$ is in the first low state, the ninth transistor T9 is turned off and the tenth transistor T10 is turned on. Thus, the second intermediate signal $i_2$ is high. The fourth inverter 504 receives the second intermediate signal $i_2$ and inverts it, so the third driver signal $d_3$ goes low.

Referring now to FIG. 5B, a schematic circuit diagram of the second output driver circuit 304b in accordance with an embodiment of the present invention is shown. The second output driver circuit 304b receives the third driver signal $d_3$ and generates the fourth driver signal $d_4$. As can be seen, the second output driver circuit 304b is a CMOS inverter formed with fifteenth and sixteenth transistors T15 and T16, which are connected in series between the first power supply ($V_{CCA}$) and ground.

When the third driver signal $d_3$ is high, the fourth driver signal $d_4$ goes low, which turns on the second output transistor OT2. Similarly, when the third driver signal $d_3$ is low, the fourth driver signal $d_4$ goes high, which turns off the second output transistor OT2.

Figure 6A:
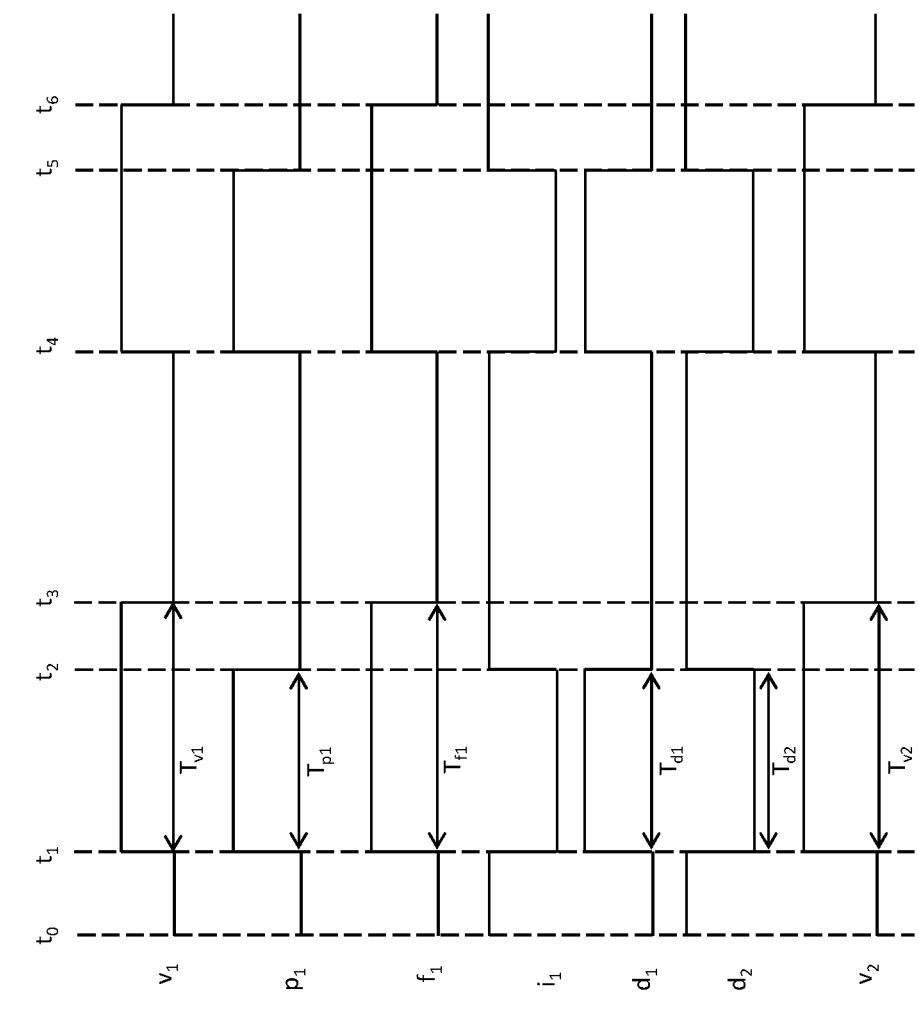
FIG. 6A is a timing diagram that illustrates a level shifting operation of the voltage translator when a first voltage signal is a low frequency signal.

Referring now to FIG. 6A, a timing diagram 600A that illustrates a level shifting operation of the voltage translator 206 when the first voltage signal $v_1$ is a low-frequency signal in accordance with an embodiment of the present invention is shown. A low-frequency first voltage signal $v_1$ corresponds to the duration of the first voltage signal $T_{v1}$ being greater than the duration of the first one-shot pulse signal $T_{p1}$.

During time period $t_0$-$t_1$, the first voltage signal $v_1$ is in the first low state, and the first one-shot pulse signal $p_1$, the first feedforward signal $f_1$, the first driver signal $d_1$, and the second voltage signal $v_2$ are in the second low state. Further, the first intermediate signal $i_1$ and the second driver signal $d_2$ are in the second high state.

At time $t_1$, the first voltage signal $v_1$ transitions from the low to high. The transition is sensed by the first multivibrator 308a and the first feedforward signal generator 310a, which assert the first one-shot pulse signal $p_1$ and the first feedforward signal $f_1$, respectively. Thus, the first one-shot pulse signal $p_1$ and the first feedforward signal $f_1$ go from low to high. When the first feedforward signal $f_1$ goes high, the first transistor T1 and the first inverter 402 are activated and the second transistor T2 is deactivated. The first intermediate signal $i_1$ thus goes from high to low. The second inverter 404 receives the first intermediate signal $i_1$ (low) and activates the first driver signal $d_1$. Thus, the first driver signal $d_1$ goes high.

The first output driver circuit 304a receives the first driver signal $d_1$ (high) and activates the second driver signal $d_2$. Thus, the second driver signal $d_2$ goes low. When the second driver signal $d_2$ goes low, the first output transistor OT1 is turned on, so the voltage level at the second I/O terminal B is pulled up to the second voltage level, so the second voltage signal $v_2$ goes high.

During time period $t_1$-$t_2$, the first voltage signal $v_1$ remains in the first high state, and the first one-shot pulse signal $p_1$, the first feedforward signal $f_1$, the first driver signal $d_1$, and the second voltage signal $v_2$ remain in the second high state. Further, the first intermediate signal $i_1$ and the second driver signal $d_2$ remain in the second low state.

At time $t_2$, the first one-shot pulse duration $T_{p1}$ elapses. Thus, the first one-shot pulse signal $p_1$ goes from high to low. However, the first feedforward signal $f_1$ remains high because the first feedforward signal duration $T_{f1}$ has not elapsed. Hence, the first transistor T1 and the first inverter 402 remain activated. The first inverter 402 receives the first one-shot pulse signal $p_1$ (low) and inverts it to generate the first intermediate signal $i_1$. Thus, the first intermediate signal $i_1$ goes high. The second inverter 404 receives the first intermediate signal $i_1$ (high) and de-asserts the first driver signal $d_1$. Thus, the first driver signal $d_1$ goes low.

The first output driver circuit 304a receives the first driver signal $d_1$ (now low) and deactivates the second driver signal $d_2$. Thus, the second driver signal $d_2$ goes high, which turns off the first output transistor OT1. The first voltage signal $v_1$, however, remains high because the duration of the first voltage $T_{v1}$ has not elapsed. Thus, when the first output transistor OT1 is off and the first voltage signal $v_1$ remains in the first high state, the first resistor R1 pulls up the voltage level at the second I/O terminal B to the second voltage level, so the second voltage signal $v_2$ is maintained at the second high state.

During time period $t_2$-$t_3$, the first voltage signal $v_1$ remains in the first high state, and the first feedforward signal $f_1$, the first intermediate signal $i_1$, the second driver signal $d_2$, and the second voltage signal $v_2$ remain in the second high state. Further, the first one-shot pulse signal $p_1$ and the first driver signal $d_1$ remain in the second low state.

At time $t_3$, the first pulse duration $T_{v1}$ elapses. Thus, the first voltage signal $v_1$ goes from high to low. The transition is sensed by the first feedforward signal generator 310a, which deactivates the first feedforward signal $f_1$. Thus, the first feedforward signal $f_1$ goes from high to low. When the first feedforward signal $f_1$ is low, the first transistor T1 and the first inverter 402 are deactivated and the second transistor T2 is turned on. The first intermediate signal $i_1$ thus remains in the second high state. As a result, the first and second driver signals $d_1$ and $d_2$ remain in the second low state and the second high state, respectively. Further, the pass transistor PT is activated at time $t_3$. The pass transistor PT pulls down the voltage level at the second I/O terminal B to ground. Thus, at time $t_3$, the second voltage signal $v_2$ transitions from high to low. Hence, the duration of the second voltage signal $T_{v2}$ is equal to the time period $t_1$-$t_3$.

During time period $t_3$-$t_4$, the first voltage signal $v_1$ remains in the first low state, and the first one-shot pulse signal $p_1$, the first feedforward signal $f_1$, the first driver signal $d_1$, and the second voltage signal $v_2$ remain in the second low state. Further, the first intermediate signal $i_1$ and the second driver signal $d_2$ remain in the second high state. At time $t_4$, the first voltage signal $v_1$ transitions from the first low state to the first high state. It will be understood by a person skilled in the art that a level shifting operation during time periods $t_4$-$t_5$ and $t_5$-$t_6$ is executed in a similar manner to the level shifting operation executed during time periods $t_1$-$t_2$ and $t_2$-$t_3$, respectively.

Figure 6B:
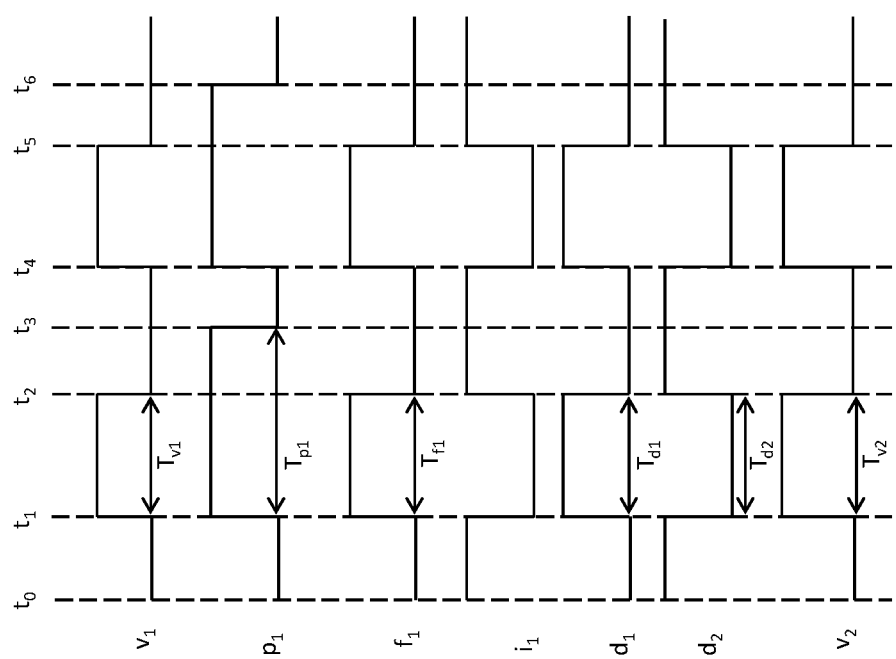
FIG. 6B is a timing diagram that illustrates the level shifting operation of the voltage translator when the first voltage signal is a high frequency signal.

Referring now to FIG. 6B, a timing diagram 600B that illustrates the level shifting operation of the voltage translator 206 when the first voltage signal $v_1$ is a high-frequency signal in accordance with an embodiment of the present invention is shown. A high-frequency first voltage signal $v_1$ corresponds to the duration of the first voltage signal $T_{v1}$ being less than the first one-shot pulse duration $T_{p1}$.

During time period $t_0$-$t_1$, the first voltage signal $v_1$ is low, and the first one-shot pulse signal $p_1$, the first feedforward signal $f_1$, the first driver signal $d_1$, and the second voltage signal $v_2$ also are low. Further, the first intermediate signal $i_1$ and the second driver signal $d_2$ are high.

At time $t_1$, the first voltage signal $v_1$ transitions from the first low state to the first high state (i.e., from 0V to 1.8V). The transition is sensed by the first monostable multi-vibrator 308a and the first feedforward signal generator 310a. The first multi-vibrator 308a and the first feedforward signal generator 310a activate the first one-shot pulse signal $p_1$ and the first feedforward signal $f_1$, respectively. Thus, the first one-shot pulse signal $p_1$ and the first feedforward signal $f_1$ go from low to high. When the first feedforward signal $f_1$ is activated, the first transistor T1 and the first inverter 402 are activated and the second transistor T2 is deactivated. The first intermediate signal $i_1$ thus transitions to the second low state. The second inverter 404 receives the first intermediate signal $i_1$ and activates the first driver signal $d_1$. Thus, the first driver signal $d_1$ transitions to the second high state.

The first output driver circuit 304a receives the first driver signal $d_1$ and activates the second driver signal $d_2$. Thus, the second driver signal $d_2$ transitions to the second low state. When the second driver signal $d_2$ is in the second low state, the first output transistor OT1 is activated. When the first output transistor OT1 is activated, the voltage level at the second I/O terminal B is pulled up to the second voltage level, thereby generating the second voltage signal $v_2$ at the second high state (i.e., a voltage level of the second voltage signal $v_2$ is equal to the second voltage level).

During time period $t_1$-$t_2$, the first voltage signal $v_1$ remains in the first high state, and the first one-shot pulse signal $p_1$, the first feedforward signal $f_1$, the first driver signal $d_1$, and the second voltage signal $v_2$ remain in the second high state. Further the first intermediate signal $i_1$ and the second driver signal $d_2$ remain in the second low state.

At time $t_2$, the first voltage signal $v_1$ goes low (i.e., the signal $v_1$ elapses). The transition is sensed by the first multi-vibrator 308a and the first feedforward signal generator 310a. The first one-shot pulse signal $p_1$ remains high as the first one-shot pulse duration $T_{p1}$ has not elapsed. The first feedforward signal generator 310a, however, deactivates the first feedforward signal $f_1$. Thus, the first feedforward signal $f_1$ transitions to the second low state. Hence, the first transistor T1 and the first inverter 402 are turned off and the second transistor T2 is turned on. The first intermediate signal $i_1$ thus transitions to the second high state. The second inverter 404 receives the first intermediate signal $i_1$ and deactivates the first driver signal $d_1$. Thus, the first driver signal $d_1$ goes from high to low.

The first output driver circuit 304a receives the first driver signal $d_1$ and deactivates the second driver signal $d_2$. Thus, the second driver signal $d_2$ transitions to the second high state, which turns off the first output transistor OT1.

The pass transistor PT is turned on at time $t_2$. As a result, the voltage level at the second I/O terminal B is pulled down to ground by way of the pass transistor PT. Thus, at time $t_2$, the second voltage signal $v_2$ transitions from high to low. Hence, the duration of the second voltage signal $T_{v2}$ is equal to the time period $t_1$-$t_2$.

During time period $t_2$-$t_3$, the first voltage signal $v_1$ remains low, as do the first feedforward signal $f_1$, the first driver signal $d_1$, and the second voltage signal $v_2$, while the first one-shot pulse signal $p_1$, the first intermediate signal $i_1$, and the second driver signal $d_2$ remain high.

At time $t_3$, the first one-shot pulse duration $T_{p1}$ elapses. Thus, the first one-shot pulse signal $p_1$ transitions from the second high state to the second low state. The first feedforward signal $f_1$, however, remains in the second high state. Hence, the first intermediate signal $i_1$, and the first and second driver signals $d_1$ and $d_2$ remain unchanged. Further, the first and second voltage signals $v_1$ and $v_2$ remain in the first and second low states, respectively.

During time period $t_3$-$t_4$, the first voltage signal $v_1$ remains in the first low state, and the first one-shot pulse signal $p_1$, the first feedforward signal $f_1$, the first driver signal $d_1$, and the second voltage signal $v_2$ remain in the second low state. Further, the first intermediate signal $i_1$ and the second driver signal $d_2$ remain in the second high state.

At time t4, the first voltage signal $v_1$ transitions from the first low state to the first high state. It will be apparent to a person skilled in the art that level shifting operations during time periods $t_4$-$t_5$ and $t_5$-$t_6$ is executed in a similar manner to the level shifting operations executed during time periods $t_1$-$t_2$ and $t_2$-$t_3$, respectively.

Although the timing diagrams 600A and 600B illustrate the level shifting operation of the voltage translator 206 when the first voltage signal $v_1$ transitions from the first low state to the first high state, it will be apparent to a person skilled in the art that the voltage translator 206 similarly executes a level shifting operation when the second voltage signal $v_2$ transitions from low to high.

The first driver signal duration $T_{d1}$ is controlled based on the first voltage signal duration $T_{v1}$ and the first one-shot pulse duration $T_{p1}$. Similarly, the third driver signal duration $T_{d3}$ is controlled based on the duration of the second voltage signal $T_{v2}$ and the second one-shot pulse duration $T_{p2}$. This prevents malfunctioning of the voltage translator 206, especially when the first and second voltage signals $v_1$ and $v_2$ are high-frequency signals. Further, the voltage translator 206 operates with similar efficiency with low as well as high-frequency signals. As a result, a need for using two voltage translators (one for level shifting low-frequency signals and another for level shifting high-frequency signals) in the bidirectional communication system 200 is eliminated. Further, due to usage of a single voltage translator (i.e., the voltage translator 206), cost and time associated with testing and debugging the bidirectional communication system 200 is less than required for conventional bidirectional communication systems.

It will be understood by those of skill in the art that the same logical function may be performed by different arrangements and configurations of transistors, resistors, capacitors, or that electronic circuits may operate using either positive or negative signals. Therefore, variations in the arrangement and configurations of some of the transistors, resistors, capacitors described above should not be considered to depart from the scope of the present invention.

The terms "low" and "high" have been used interchangeably with "low logic state" and "high logic state". For transistors, the terms gate, drain and source have been used interchangeably with gate terminal, drain terminal and source terminal, respectively. The terms "assert" and "activate" are used to mean placing a signal in its active state, for example, for a low active signal, the signal would go low when active or asserted, while for a high active signal, the signal would be high when it is active or asserted. The word "comprising" is meant to be open ended, meaning including the elements mentioned as well as other elements not mentioned, whereas the term "consisting" is a closed ended term meaning the element includes only those items listed and no other items.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A bidirectional voltage translator, comprising:
a first one-shot circuit that receives a first voltage signal V1 and
  (i) generates a first pulse signal P1 when the first voltage signal V1 transitions from a first low state to a first high state, and
  (ii) generates a first driver signal D1 based on the first pulse signal P1 and a duration of the first voltage signal (Tv1),
wherein the duration of the first voltage signal (Tv1) is a time duration for which the first voltage signal V1 remains in the first high state, and
wherein a second voltage signal V2 is generated based on the first driver signal D1; and
a second one-shot circuit that receives the second voltage signal V2 and
  (i) generates a second pulse signal P2 when the second voltage signal V2 transitions from a second low state to a second high state, and
  (ii) generates a second driver signal D2 based on the second pulse signal P2 and a duration of the second voltage signal (Tv2),
wherein the duration of the second voltage signal (Tv2) is a time duration for which the second voltage signal V2 remains in the second high state, and
wherein the first voltage signal V1 is generated based on the second driver signal D2;
wherein the first one-shot circuit comprises:
  a first monostable multi-vibrator that receives the first voltage signal V1 and generates the first pulse signal P1 when the first voltage signal V1 transitions from the first low state to the first high state;
  a first feedforward signal generator that receives the first voltage signal V1 and generates a first feedforward signal F1 based on the duration of the first voltage signal duration (Tv1); and
  a first driver circuit connected to the first multi-vibrator and the first feedforward signal generator for receiving the first pulse signal P1 and the first feedforward signal F1, respectively, and generating the first driver signal D1.

2. The bidirectional voltage translator of claim 1, wherein the first driver circuit comprises:
first and second transistors having gate terminals that receive the first feedforward signal F1;
a first inverter that receives the first pulse signal P1, and is connected to a drain terminal of the second transistor for outputting a first intermediate signal, wherein the first inverter also is connected to a drain terminal of the first transistor; and a second inverter that receives the first intermediate signal and generates the first driver signal D1.

3. The bidirectional voltage translator of claim 2, wherein:
the first inverter comprises:
a third transistor having a gate terminal that receives the first pulse signal P1; and
a fourth transistor having a gate terminal connected to the gate terminal of the third transistor, a source terminal connected to the drain terminal of the first transistor, and a drain terminal connected to a drain terminal of the third transistor for outputting the first intermediate signal; and
the second inverter comprises:
a fifth transistor having a gate terminal that receives the first intermediate signal; and
a sixth transistor having a gate terminal connected to the gate terminal of the fifth transistor, and a drain terminal connected to a drain terminal of the fifth transistor for outputting the first driver signal D1.

4. The bidirectional voltage translator of claim 1, further comprising:
a second driver circuit connected to the first one-shot circuit for receiving the first driver signal D1, and generating a third driver signal D3; and
a first output transistor connected to the second driver circuit for receiving the third driver signal D3, and generating the second voltage signal V2.

5. The bidirectional voltage translator of claim 4, wherein the second driver circuit comprises:
a first transistor having a gate terminal that receives the first driver signal D1; and
a second transistor having a gate terminal connected to the gate terminal of the first transistor, and a drain terminal connected to a drain terminal of the first transistor for outputting the third driver signal D3.

6. The bidirectional voltage translator of claim 4, wherein the second one-shot circuit comprises:
a second monostable multi-vibrator that receives the second voltage signal V2 and generates the second pulse signal P2 when the second voltage signal transitions from the second low state to the second high state;
a second feedforward signal generator that receives the second voltage signal V2 and generates a second feedforward signal F2 based on the duration of the second voltage signal (Tv2); and
a third driver circuit connected to the second multi-vibrator and the second feedforward signal generator for receiving the second pulse signal P2 and the second feedforward signal F2, respectively, and generating the second driver signal D2.

7. The bidirectional voltage translator of claim 6, wherein the third driver circuit comprises:
first and second transistors having gate terminals for receiving the second feedforward signal F2;
a first inverter that receives the second pulse signal P2, and is connected to a drain terminal of the second transistor for outputting a second intermediate signal, wherein the first inverter also is connected to a drain terminal of the first transistor; and
a second inverter that receives the second intermediate signal and generates the second driver signal D2.

8. The bidirectional voltage translator of claim 7, wherein:
the first inverter comprises:
a third transistor having a gate terminal that receives the second pulse signal P2; and
a fourth transistor having a gate terminal connected to the gate terminal of the third transistor, a source terminal connected to the drain terminal of the first transistor, and a drain terminal connected to a drain terminal of the third transistor for outputting the second intermediate signal; and
the second inverter comprises:
a fifth transistor having a gate terminal that receives the second intermediate signal; and
a sixth transistor having a gate terminal connected to the gate terminal of the fifth transistor, and a drain terminal connected to a drain terminal of the fifth transistor for outputting the second driver signal D2.

9. The bidirectional voltage translator of claim 6, further comprising:
a fourth driver circuit connected to the second one-shot circuit for receiving the second driver signal D2, and generating a fourth driver signal D4; and
a second output transistor connected to the fourth driver circuit for receiving the fourth driver signal D4, and generating the first voltage signal V1.

10. The bidirectional voltage translator of claim 9, wherein the fourth driver circuit comprises:
a first transistor having a gate that receives the second driver signal D2; and
a second transistor having a gate connected to the gate of the first transistor, and a drain connected to a drain of the first transistor for outputting the fourth driver signal D4.

11. A system for interfacing a first digital device that operates at a first voltage level and a peripheral device that operates at a second voltage level that is different from the first voltage level, the system comprising:
a first one-shot circuit that receives a first voltage signal V1 and
(i) generates a first pulse signal P1 when the first voltage signal V1 transitions from a first low state to a first high state, and
(ii) generates a first driver signal D1 based on the first pulse signal P1 and a first duration Tv1 of the first voltage signal V1,
wherein the first duration Tv1 is the length of time that the first voltage signal remains in the first high state, and
wherein a second voltage signal V1 is generated based on the first driver signal D1 and provided to the peripheral device; and
a second one-shot circuit that receives the second voltage signal V2 and
(i) generates a second pulse signal P2 when the second voltage signal V2 transitions from a second low state to a second high state, and
(ii) generates a second driver signal D2 based on the second pulse signal P2 and a second duration Tv2 of the second voltage signal V2,
wherein the second duration Tv2 is the time that the second voltage signal V2 remains in the second high state, and
wherein the first voltage signal V1 is generated based on the second driver signal D2 and provided to the first digital device;
wherein the first one-shot circuit comprises:
a first monostable multi-vibrator that receives the first voltage signal V1 and generates the first pulse signal P1 when the first voltage signal V1 transitions from the first low state to the first high state;
a first feedforward signal generator that receives the first voltage signal V1 and generates a first feedforward signal F1 based on the first duration Tv1 of the first voltage signal V1; and a first driver circuit connected to the first multi-vibrator and the first feedforward signal generator for receiving the first pulse signal P1 and the first feedforward signal F1, respectively, and generating the first driver signal D1.

12. The system of claim 11, wherein the first driver circuit comprises:

first and second transistors having gate terminals that receive the first feedforward signal F1;

a first inverter that receives the first pulse signal P1, and is connected to a drain terminal of the second transistor for outputting a first intermediate signal, wherein the first inverter also is connected to a drain terminal of the first transistor; and a second inverter that receives the first intermediate signal and generates the first driver signal D1.

13. The system of claim 11, further comprising:

a second driver circuit connected to the first one-shot circuit for receiving the first driver signal D1, and generating a third driver signal D3; and a first output transistor connected to the second driver circuit for receiving the third driver signal D3, and generating the second voltage signal V2.

14. The system of claim 13, wherein the second driver circuit comprises:

a first transistor having a gate terminal that receives the first driver signal D1; and a second transistor having a gate terminal connected to the gate terminal of the first transistor, and a drain terminal connected to a drain terminal of the first transistor for outputting the second driver signal D2.

15. The system of claim 11, wherein the second one-shot circuit comprises:

a second monostable multi-vibrator that receives the second voltage signal V2 and generates the second pulse signal P2 when the second voltage signal V2 transitions from the second low state to the second high state;

a second feedforward signal generator that receives the second voltage signal V2 and generates a second feedforward signal F2 based on the second duration Tv2 of the second voltage signal V2; and a third driver circuit connected to the second multi-vibrator and the second feedforward signal generator for receiving the second pulse signal P2 and the second feedforward signal F2, respectively, and generating the second driver signal D2.

16. The system of claim 15, wherein the third driver circuit comprises:

first and second transistors having gate terminals that receive the second feedforward signal F2;

a first inverter that receives the second pulse signal P2, and is connected to a drain terminal of the second transistor for outputting a second intermediate signal, wherein the first inverter also is connected to a drain terminal of the first transistor; and a second inverter that receives the second intermediate signal and generates the second driver signal D2.

17. The system of claim 15, further comprising:

a fourth driver circuit connected to the second one-shot circuit for receiving the second driver signal D2, and generating a fourth driver signal D4; and a second output transistor connected to the fourth driver circuit for receiving the fourth driver signal D4 and generating the first voltage signal V1.

18. The system of claim 17, wherein the fourth driver circuit comprises:

a first transistor having a gate that receives the second driver signal; and a second transistor having a gate connected to the gate of the first transistor, and a drain connected to a drain of the first transistor for outputting the fourth driver signal D4.

\* \* \* \* \*